(12) United States Patent
Mizutani

(10) Patent No.: US 6,802,595 B2
(45) Date of Patent: Oct. 12, 2004

(54) INK-JET RECORDING HEAD AND INK-JET RECORDING APPARATUS

(75) Inventor: Michinari Mizutani, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/211,519

(22) Filed: Aug. 5, 2002

(65) Prior Publication Data

US 2003/0043236 A1 Mar. 6, 2003

(30) Foreign Application Priority Data

Aug. 31, 2001 (JP) ........................................ 2001-263724

(51) Int. Cl.[7] .............................. B41J 2/14; B41J 2/16; B41J 2/05
(52) U.S. Cl. .......................................... 347/50; 347/58
(58) Field of Search .............................. 347/50, 57, 58, 347/99

(56) References Cited

U.S. PATENT DOCUMENTS 5,189,787 A * 3/1993 Reed et al. .................... 347/50
6,328,422 B1 12/2001 Watanabe et al.

FOREIGN PATENT DOCUMENTS

JP             63-53     *   3/2001              B41J/2/05
JP           2001-063053       3/2001              B41J/2/05

* cited by examiner

*Primary Examiner*—Michael Brooke
(74) *Attorney, Agent, or Firm*—Fitzpatrick, Cella, Harper & Scinto

(57) ABSTRACT

A flexible-film wire substrate is bent at first, second and third bent portions. Wires of a flexible wire pattern are deflected at least between the second bent portion and the third bent portion so that a pitch increases from the second bent portion toward the third bent portion. By bending the first, second and third bent portions so that the wires are substantially orthogonal to each bending line, the flexible-film wire substrate can be excellently bent without influencing the flexible wire pattern on the flexible-film wire substrate.

12 Claims, 12 Drawing Sheets

INK-JET RECORDING HEAD AND INK-JET RECORDING APPARATUS

BACKGROUND OF THE INVENTION

1. Field of the Invention

The present invention relates to an ink-jet recording head that performs recording by discharging a recording liquid, such as ink or the like, onto a recording medium, and an ink-jet recording apparatus including the same. More particularly, the invention relates to a flexible-film wire substrate which is used by being bent in such a recording head.

2. Description of the Related Art

Ink-jet recording apparatuses adopt a so-called non-impact recording method, and have the features that high-speed recording and recording for various recording media can be performed, and less noise is produced during recording. Accordingly, ink-jet recording apparatuses are widely adopted as printers, or recording mechanisms for word processors, facsimile apparatuses, copiers and the like.

In a typical ink-jet recording method, recording is performed on a recording medium, such as paper or the like, by discharging liquid droplets from fine discharge ports using electrothermal transducers. Such ink-jet recording is usually performed using an ink-jet recording head having nozzles for forming liquid droplets, and a supply system for supplying the head with a recording liquid, such as ink or the like.

In ink-jet recording heads using electrothermal transducers, electrothermal transducers are provided within a pressure chamber. Thermal energy is supplied to a recording liquid by providing electric pulses, serving as a recording signal, and the pressure of each generated bubble (due to film boiling) of the recording liquid caused by a phase change of the recording liquid at that time is utilized for discharging a liquid droplet for recording. Such ink-jet recording heads using electrothermal transducers utilize two methods, i.e., a method in which a recording liquid is discharged in parallel to a substrate on which electrothermal transducers are arranged (an edge shooter method), and a method in which a recording liquid is discharged perpendicularly to a substrate on which electrothermal transducers are arranged (a side shooter method).

As a result of recent tendency of reduction in the size, realization of a high speed, multicolor printing and high picture quality of ink-jet recording heads, a plurality of recording-element substrates are provided on one ink supply/holding member with an interval of several millimeters to several tens of millimeters, and very precise bonding and fixing with an interval of several micrometers to several tens of micrometers are being performed. FIG. 11 illustrates the configuration of a conventional ink-jet recording head unit. FIG. 12 illustrates a recording-element substrate 1100 in detail.

In FIG. 12, a plurality of discharge ports 1108 for discharging ink are opened in the recording-element substrate 1100, and an ink supply port 1109 for supplying ink is opened at the back of the discharge ports 1108 at a length substantially equal to the length of the string of the discharge ports 1108. The plurality of discharge ports 1108 are disposed so as to correspond to electrothermal transducers 1103 formed on a substrate 1101. Although in FIG. 12, only several discharge ports 1108 are illustrated, several tens to several hundreds of discharge ports 1108 are opened in actual products.

In order to discharge ink, electrodes on the recording-element substrate 1100 are electrically connected to electrode terminals on a flexible-film wire substrate 2 shown in FIG. 11, and an electric signal for discharging ink from the discharge ports 1108 is supplied from output terminals of the flexible-film wire substrate 2. Input terminals 204 on the flexible-film wire substrate 2 are electrically connected to output terminals of a wire substrate 5 having external input pads 7 for supplying the ink-jet recording head with an electric signal representing recording information or the like from the main body of the recording apparatus.

As shown in FIG. 11, the flexible-film wire substrate 2 to which the recording-element substrate 1100 is electrically connected is bonded and fixed on an ink supply/holding member 4.

A wire connection portion (input terminal portion) of the flexible-film wire substrate 2 includes signal-line input terminals 204 where relatively small currents flow, and power-supply-line input terminals to be connected to a power supply, ground and the like, for supplying a recording liquid with thermal energy. A wire connection portion (output terminal portion) of the wire substrate 5 includes signal-line output terminals and power-supply-line output terminals corresponding to the signal-line input terminals and the power-supply-line input terminals, respectively. The input terminals of the flexible-film wire substrate 2 and the output terminals of the wire substrates 5, whose number is several tens to several hundreds, are electrically connected at a pitch of 100–500 $\mu$m.

By bending the flexible-film wire substrate 2 so as to provide two crest portions and a valley portion between these crest portions, it is possible to bend the flexible-film wire substrate 2 for a recording head 1001 along the ink supply/holding member 4, and dispose a sheet pressing roller near the recording-element substrate 1100 while preventing interference between the wire substrate 5 and the sheet pressing roller, thereby reducing the size of the apparatus (see Japanese Patent Application Laid-Open (Kokai) No. 2001-063053 (2001)).

However, the above-described ink-jet recording head has the following problems.

In the wire connection portion of the wire substrate 5, in contrast to the signal-line connection terminals where relatively small currents flow, each of the power-supply-line connection terminals to be connected to the power supply, ground and the like, for providing the recording liquid with thermal energy comprises a plurality of connection terminals in order to reduce connection resistance. Accordingly, the number of terminals at the wire connection portion of the flexible-film wire substrate 2 increases by an amount of providing a plurality of terminals corresponding to the power-supply-line connection terminals, resulting in an increase in the width of the entire wire connection portion. Furthermore, as a result of recent tendency of a high speed and high picture quality of the ink-jet recording head, the number of nozzles and the number of electrothermal transducers also increase, resulting in an increase in the number of power-supply lines for the power supply, ground and the like, provided on the flexible-film wire substrate 2.

As a result of such an increase in the number of the power-supply lines for the power supply, ground and the like, provided on the flexible-film wire substrate 2, the width of the entire flexible-film wire substrate 2 also increases. Such an increase in the width of the flexible-film wire substrate 2 has been a problem for reducing the size of the ink-jet recording head.

However, if it is intended to reduce the width of the flexible-film wire substrate 2, the width W of each connection terminal for the power-supply lines for the power supply, ground and the like is also reduced, thereby causing the problems that, when electrically connecting the terminal connection portion (the connection portion of input terminals) of the flexible-film wire substrate 2 to the terminal connection portion (the connection portion of output terminals) of the wire substrate 5, open circuit or short circuit between terminals may occur, resulting in degradation in reliability.

A structure of the flexible-film wire substrate 2 for securing reliability of terminal connection portions without sacrificing reduction in the size of the head may be considered, in which the width of portions other than terminal connection portions of the flexible-film wire substrate 2 is small while sufficiently maintaining the width of terminal connection portions.

In such a flexible-film wire substrate 2 in which the width of the terminal connection portion to be connected to the wire substrate 5 is larger than the width of other portions, when forming a wire pattern from a narrow region to a wide region, in order to make the interval between wires of the wire pattern at the wide region larger than at the narrow region, the wire pattern has an oblique portion from the narrow region to the wide region (see FIG. 9).

When, as shown in FIG. 11, disposing the external input pads 7 of the wire substrate 5 and the recording-element substrate 1100 on different surfaces of the ink supply/holding member 4, the flexible-film wire substrate 2 for electrically connecting the wire substrate 5 to the recording-element substrate 1100 is bent.

In order to realize a small-size head and prevent an increase in the wire resistance in the wire pattern, it is necessary to minimize the length of the wire pattern as well as the length of the flexible-film wire substrate 2. For that purpose, it is necessary to provide a valley portion near a portion where the wire pattern between the narrow portion and the wide portion of the flexible-film wire substrate 2 is oblique (having a tapered shape).

In such a case, however, if it is intended to bend the flexible-film wire substrate 2 at a tapered portion shown in FIG. 9, the bending property is inferior because the wire pattern is not perpendicular to a bent portion 5B, thereby causing a problem in the production process. Even if the flexible-film wire substrate 2 happens to be bent, since the flexible wire pattern tends to be bent around a line perpendicular to the wire pattern, the flexible wire pattern is bent in a sagged state, thereby causing pronounced projections and recesses on the flexible wire pattern. As a result, when mounting the recording head cartridge in a carriage of the apparatus main body, the projections and recesses on the flexible wire pattern interfere with the carriage.

SUMMARY OF THE INVENTION

The present invention has been made in consideration of the above-described problems.

It is an object of the present invention to provide a configuration allowing to excellently bend a flexible-film wire substrate without influencing a wire pattern on the substrate, in an ink-jet recording apparatus having the flexible-film wire substrate, whose width at a terminal connection portion is larger than in other portions, having a wire pattern formed from a narrow region to a wide region thereon, and bent in a predetermined state.

According to one aspect of the present invention, in an ink-jet recording head including a flexible-film wire substrate, a recording-element substrate, including energy generation elements for generating energy for discharging a recording liquid. The recording-element substrate is electrically connected to the flexible-film wire substrate. The recording head also includes a wire substrate where a signal for controlling generation of the energy on the recording-element substrate is input from an external apparatus. The wire substrate is electrically connected to the recording-element substrate via a plurality of wires formed on the flexible-film wire substrate. The flexible-film wire substrate is bent so as to provide a first crest portion near the recording-element substrate, a second crest portion near the wire substrate, and a valley portion positioned between the first crest portion and the second crest portion. A bent portion of each of the first crest portion and the second crest portion is substantially linear over the entire region. The plurality of wires are bent so that a pitch increases from the valley portion to the second crest portion on the flexible-film wire substrate at least between the valley portion and the second crest portion. The plurality of wires are substantially orthogonal to respective bent portions of the first crest portion, the second crest portion and the valley portion.

According to this configuration, in the ink-jet recording head of the present invention, by increasing the width of the flexible-film wire substrate without increasing the size of the recording head, the width W of connection terminals for power-supply lines to be connected to a power supply, ground and the like is also increased. As a result, it is possible to improve in reliability in electric connection between a terminal connection portion (a connection portion of input terminals) of the flexible-film wire substrate and a terminal connection portion (a connection portion of output terminals) of the wire substrate, and prevent break of wires while excellently maintaining the bending property of the flexible-film wire substrate.

In the ink-jet recording head of the invention, a width of the flexible-film wire substrate at the second crest portion may be larger than a width at the first crest portion.

It is preferable that the bent portion of the valley portion is substantially linear at least near a central portion of the valley portion. It is thereby possible to suppress generation of projections and recesses conforming to the shape of wires on the flexible-film wire substrate, and prevent the flexible-film wire substrate from interfering with a sheet pressing roller or a carriage. In this case, it is more preferable that the bent portion of the valley portion is substantially linear over the entire region.

According to another aspect of the present invention, an ink-jet recording apparatus includes the above-described ink-jet recording head, a carriage for mounting the ink-jet recording head, and conveyance means for conveying a recording medium. The ink-jet recording apparatus performs recording by causing the recording liquid discharged from the ink-jet recording head to adhere onto the recording medium. The conveyance means is positioned near the valley portion of the ink-jet recording head. According to this configuration, in the ink-jet recording apparatus of the present invention, reduction in the size of the apparatus is achieved by disposing the sheet pressing roller near the recording-element substrate while preventing interference between the flexible-film wire substrate and the sheet pressing roller.

As described above, according to the present invention, in the ink-jet recording head having the flexible-film wire substrate, whose width at a terminal connection portion is larger than in other portions, having a wire pattern formed from a narrow region to a wide region thereon, and bent so as to provide two crest portions and a valley portion between the two crest portions, a bent portion of each of the crest portions and the valley portion and the wire pattern on the flexible substrate are substantially orthogonal, and particularly, the wire pattern near the bent portion of the valley portion positioned at a portion where the width of the substrate widens is perpendicular to the bending line, so that the flexible substrate can be bent with producing little projections and recesses. Accordingly, when mounting the ink-jet recording head having the flexible-film wire substrate in the printer main body, the flexible-film wire substrate does not interfere with the sheet pressing roller and the like of the printer main body. Furthermore, since the sheet pressing roller near the printer main body can be disposed near the recording-element substrate while preventing interference between the flexible-film wire substrate and the sheet pressing roller by the valley portion of the flexible-film wire substrate, the size of the ink-jet recording apparatus can be reduced.

DESCRIPTION OF THE PREFERRED EMBODIMENTS

Figure 1:
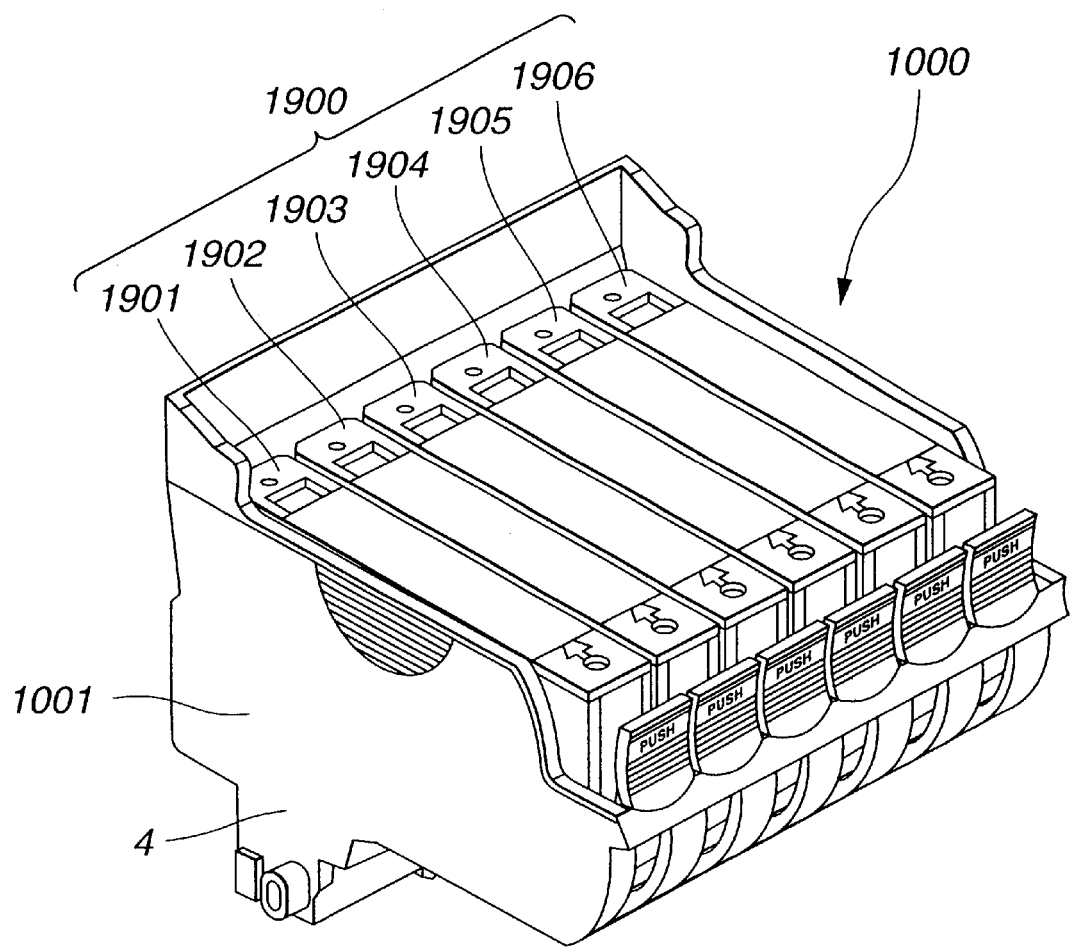
FIG. 1 is a perspective view illustrating a state of mounting ink tanks of an ink-jet recording head according to a first embodiment of the present invention.
Figure 2:
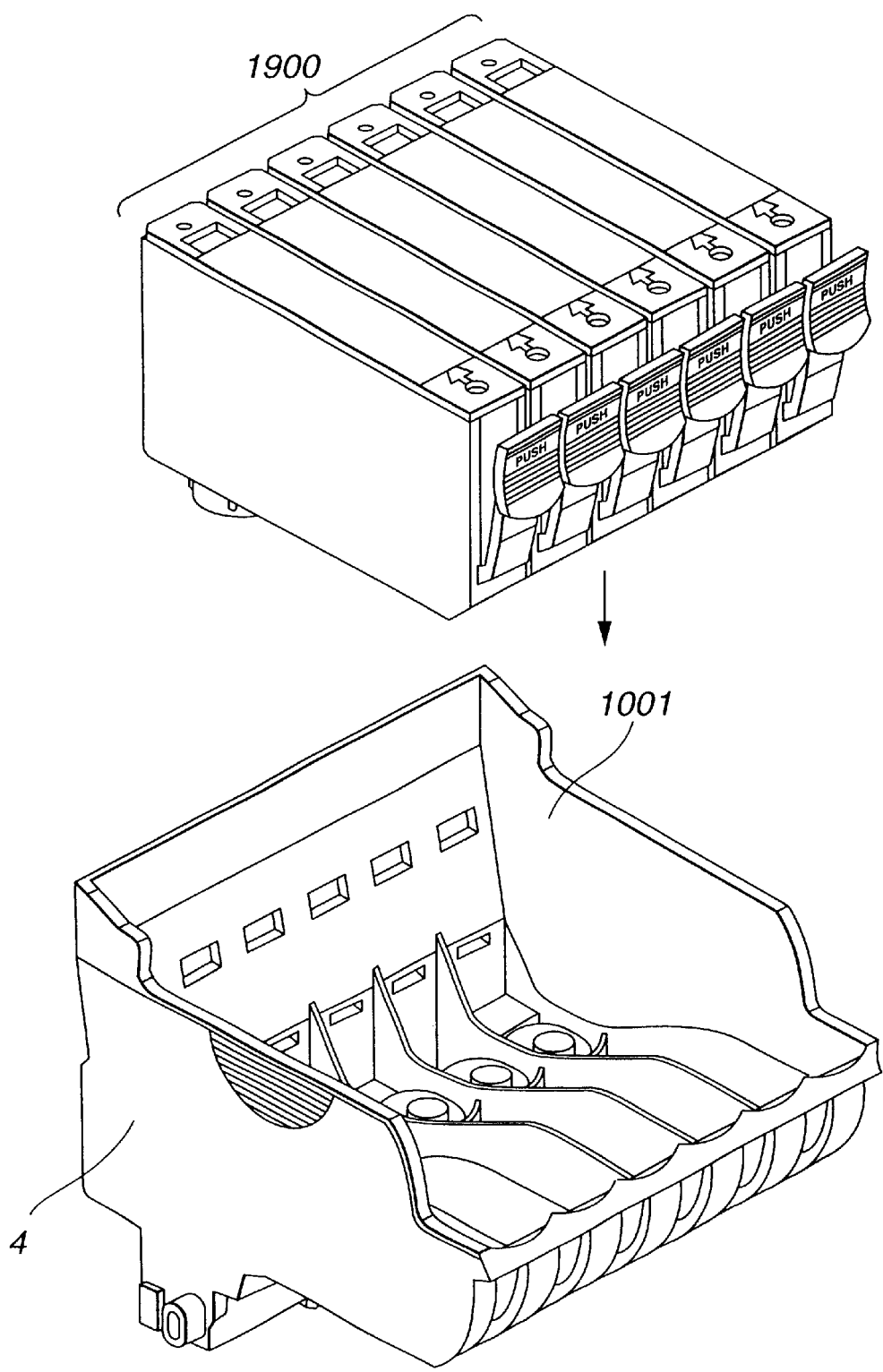
FIG. 2 is a perspective view illustrating a state in which the ink tanks shown in FIG. 1 are detached.
Figure 3:
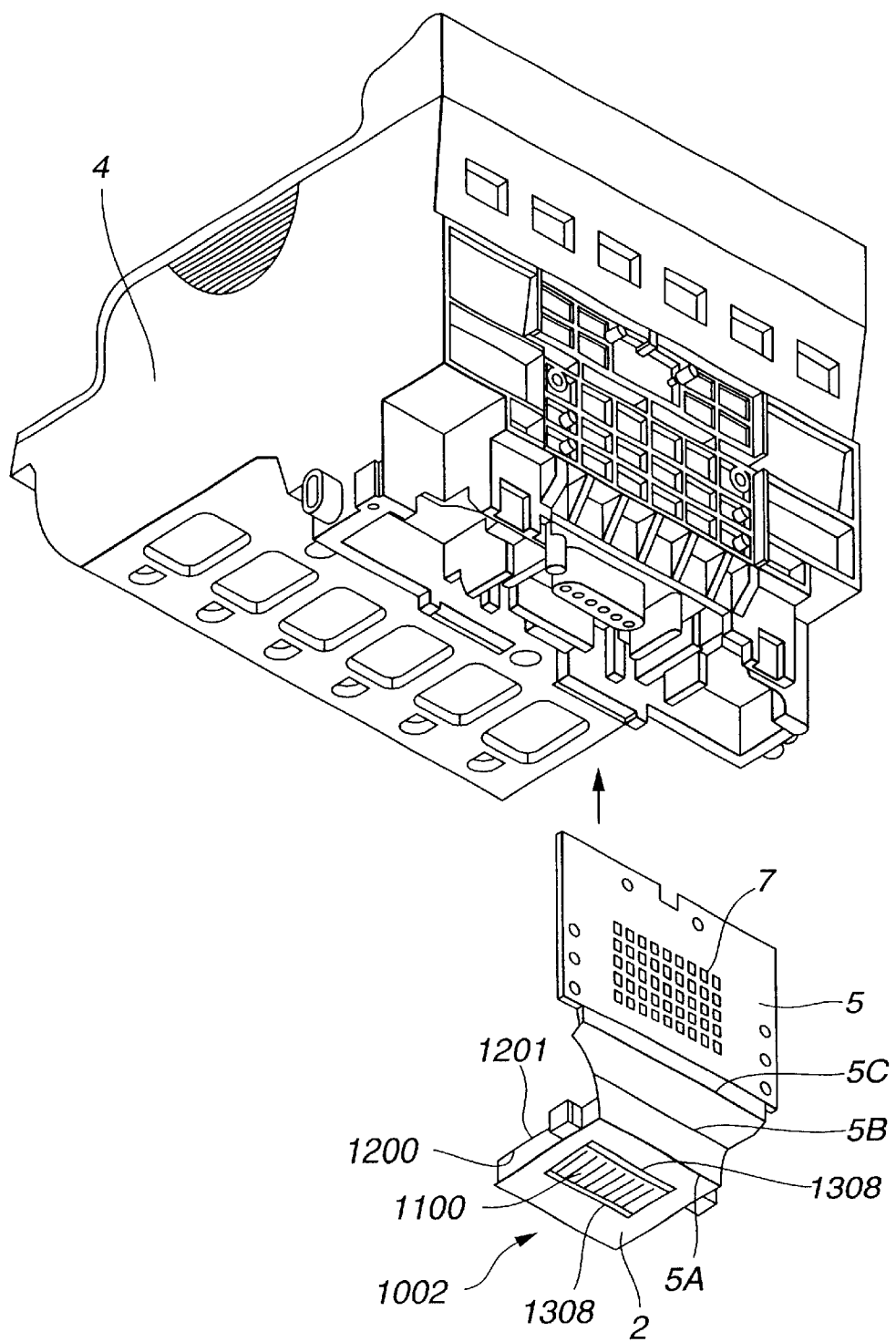
FIG. 3 is a perspective view of the ink-jet recording head of the first embodiment, as seen from a lower back side.

Preferred embodiments of the present invention will now be described with reference to the drawings.
(First Embodiment)
FIG. 1 is a perspective view illustrating a state of mounting ink tanks of an ink-jet recording apparatus according to a first embodiment of the present invention. FIG. 2 is a perspective view illustrating a state in which the ink tanks shown in FIG. 1 are detached. FIG. 3 is a perspective view illustrating the ink-jet recording head of the first embodiment, as seen from a lower back side. FIG. 3 indicates that a flexible-film wire substrate 2 according to the first embodiment is bent at three portions, i.e., bent portions 5A, 5B and 5C.

A recording head 1001 shown in FIGS. 1 and 2 is a component constituting a recording-head cartridge 1000, which includes the recording head 1001, and ink tanks 1900 (1901, 1902, 1903, 1904, 1905 and 1906) detachably mounted in the recording head 1001. The recording-head cartridge 1000 is fixed and supported by position determination means and electric contacts of a carriage (not shown) provided in the main body of the ink-jet recording apparatus, and is detachably mounted on the carriage. The carriage can move in a direction crossing a supply/conveying direction of a recording medium, such as paper or the like, facing an ink discharge unit of the recording head 1001.

The ink tanks 1901, 1902, 1903, 1904, 1905 and 1906 are for black ink, light cyan ink, light magenta ink, cyan ink, magenta ink and yellow ink, respectively. By thus making each of the ink tanks 1901, 1902, 1903, 1904, 1905 and 1906 detachably mountable in the recording head 1001 so as to be exchanged, the running cost in printing in the ink-jet recording apparatus is reduced.

Ink discharge means of the recording head 1001 is side-shooter-type liquid discharge means according to a bubble-jet method in which recording is performed using electrothermal transducers for generating thermal energy for causing film boiling in ink in accordance with an electric signal.

In the ink-jet recording head shown in FIG. 3, the flexible-film wire substrate 2 having a recording-element substrate 1100 electrically connected thereto is bonded and fixed on an ink supply/holding member 4.

Figure 4:
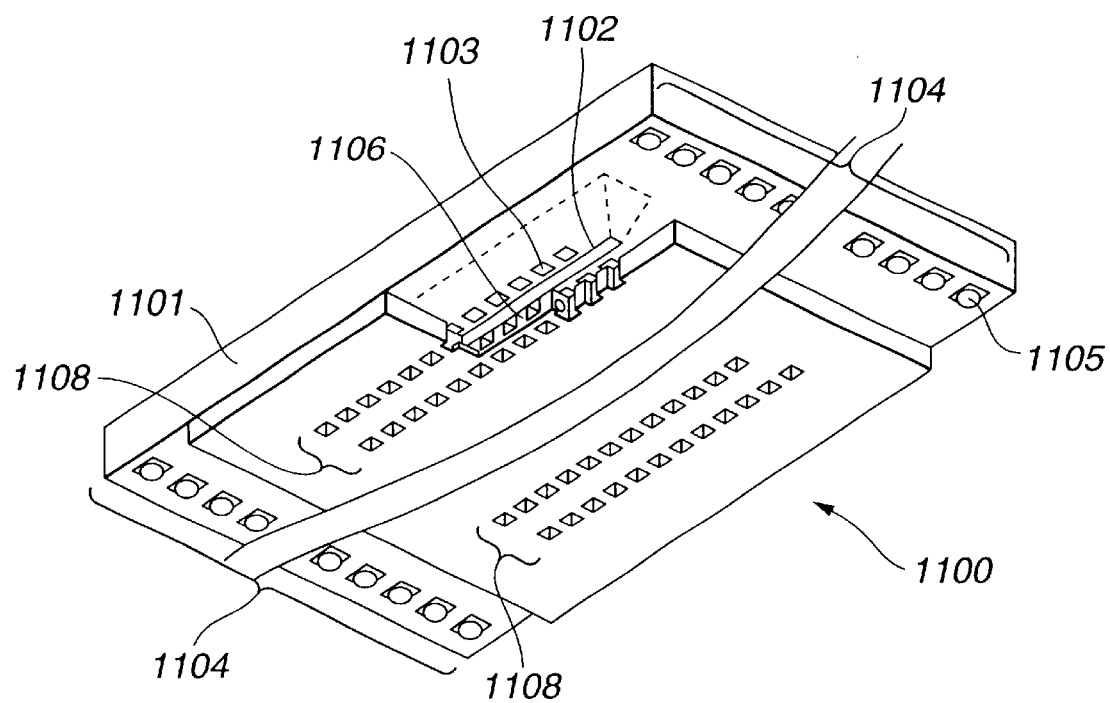
FIG. 4 is a partially omitted perspective view illustrating the configuration of a recording-element substrate of the ink-jet recording head of the first embodiment.

FIG. 4 is a perspective view partially omitted for illustrating the configuration of the recording-element substrate 1100. The recording-element substrate 1100 is obtained, for example, by forming a thin-film orifice plate on a Si substrate 1101 having a thickness of 0.5–1 mm. Six ink supply ports 1102, each comprising a groove-shaped threaded opening, are formed as ink channels for six colors, and staggered electrothermal transducers 1103 are disposed at both sides of each of the ink supply ports 1102. The electrothermal transducers 1103 and electric wires, made of Al or the like, for supplying the electrothermal transducers 1103 with electric power are formed according to a film forming technique. A bump 1105 made of Au or the like is provided on each electrode portion 1104 for supplying the corresponding electric wire with electric power.

The ink supply ports 1102 are formed by performing anisotropic etching utilizing the crystal orientations of the Si substrate 1101. When the Si substrate 1101 has crystal orientations of <100> on the wafer surface, and <111> in the direction of the thickness, etching progresses with an angle of about 54.7 degrees according to anisotropic etching using an alkaline solution (KOH, TMAH, hydrazine or the like). Etching is performed to a desired depth according to this method.

Ink channel walls 1106 for forming ink channels corresponding to the electrothermal transducers 1103, and discharge ports 1108 are formed according to photolithography. Six discharge ports 1108 corresponding to ink liquids of six colors are formed. The electrothermal transducers 1103 are formed so as to face the discharge ports 1108. Ink discharge is performed by generating bubbles of respective ink liquids supplied from the corresponding ink supply ports 1102, by the corresponding electrothermal transducers 1103.

In a first plate 1200 shown in FIG. 3, six ink supply ports 1201 (hidden in FIG. 3) in the recording-element substrate 1100 for supplying the recording-element substrate 1100 with ink liquids of six colors are formed. The six ink supply ports 1102 in the recording-element substrate 1100 correspond to the six ink supply ports 1201 in the first plate 1200. The recording-element substrate 1100 is bonded and fixed on the first plate 1200 with excellent positional accuracy. A first adhesive (not shown) used for bonding is coated on the first plate 1200 with a shape substantially the same as the shape of the recording-element substrate 1100, in a sate of not producing an air path between adjacent ink supply ports. For example, it is desirable that the first adhesive desirably has a low viscosity, a thin bonded layer formed on a contact surface, a relatively large hardness after being cured, and an ink resisting property. The first adhesive is, for example, a thermosetting adhesive including an epoxy resin as the main component. The thickness of the adhesive is desirably equal to or less than 50 μm.

The flexible-film wire substrate 2 is for applying an electric signal for discharging ink to the recording-element substrate 1100, and includes an opening (a device hole) for incorporating the recording-element substrate 1100, electrode terminals (not shown) corresponding to the electrode portions 1104 on the recording-element substrate 1100, and external-signal input terminals (not shown), positioned at end portions of the flexible-film wire substrate 2, for receiving an electric signal from the apparatus main body. The flexible-film wire substrate 2 and the recording-element substrate 1100 are electrically connected. In one connection method, after coating a thermosetting adhesive resin (not shown) between the electrode portions 1104 of the recording-element substrate 1100 and electrode terminals (not shown) on the flexible-film wire substrate 2, the electrode portions 1104 of the recording-element substrate 1100 and the electrode terminals on the flexible-film wire substrate 2 are heated and pressed at a time using a heating tool. The thermosetting adhesive resin is thereby cured, and, as a result, the electrode portions 1104 and the electrode terminals are electrically connected at a time. The flexible-film wire substrate 2 is a flexible film made of polyimide. A wire pattern is formed on this film.

The first plate 1200 is, for example, made of alumina ($Al_2O_3$). The material for the first plate 1200 is not limited to alumina. Any other appropriate material having a coefficient of linear expansion equivalent to that of the recording-element substrate 1100 and a thermal conductivity equal to or larger than that of the recording-element substrate 1100 may also be used. In order to electrically connect the recording-element substrate 1100 and the flexible-film wire substrate 2 in the form of a plane, the recording-element substrate 1100 is bonded on the first plate 1200 using a second adhesive (not shown), and the back of the flexible-film wire substrate 2 is bonded and fixed using a third adhesive (not shown).

The flexible-film wire substrate 2 is bonded on the first plate 1200, also is bent along three sides of the first plate 1200, and is bonded using the third adhesive on a side of the first plate 1200. An adhesive having a low viscosity, a thin adhesive layer formed on a contact surface, and ink-resistive property is used as the second adhesive. For example, a thermosetting adhesive containing an epoxy resin as the main component and providing a film having a thickness of 10–100 μm is used as the third adhesive.

Electric connection portions between the recording-element substrate 1100 and the flexible-film wire substrate 2 of a recording-element unit 1002 having the above-described configuration are sealed using a first sealing material (not shown) and a second sealing material 1308, in order to protect the electric connection portions from erosion caused by ink, and an external shock. The first sealing material seals mainly an outer circumferential portion of the recording-element substrate 1100, and the second sealing material 1308 seals edges of the opening of the flexible-film wire substrate 2.

Input terminals 204 of the flexible-film wire substrate 2 are electrically connected to output terminals of a wire substrate 5 having a plurality of external input pads 7 for supplying electric signals, representing recording information and the like, from the main body of the recording apparatus to the ink-jet recording head (the recording-element substrate 1100).

The recording-element substrate 1100 and the wire substrate 5 are usually held on different surfaces of the ink supply/holding member 4. According to this configuration, the direction of ink discharge toward the surface of the recording sheet differs from the direction of electric connection of the external input pads 7 on the wire substrate 5 with respect to the apparatus main body, resulting in an increase in the degree of freedom in design of a recording-sheet supply mechanism.

Figure 5:
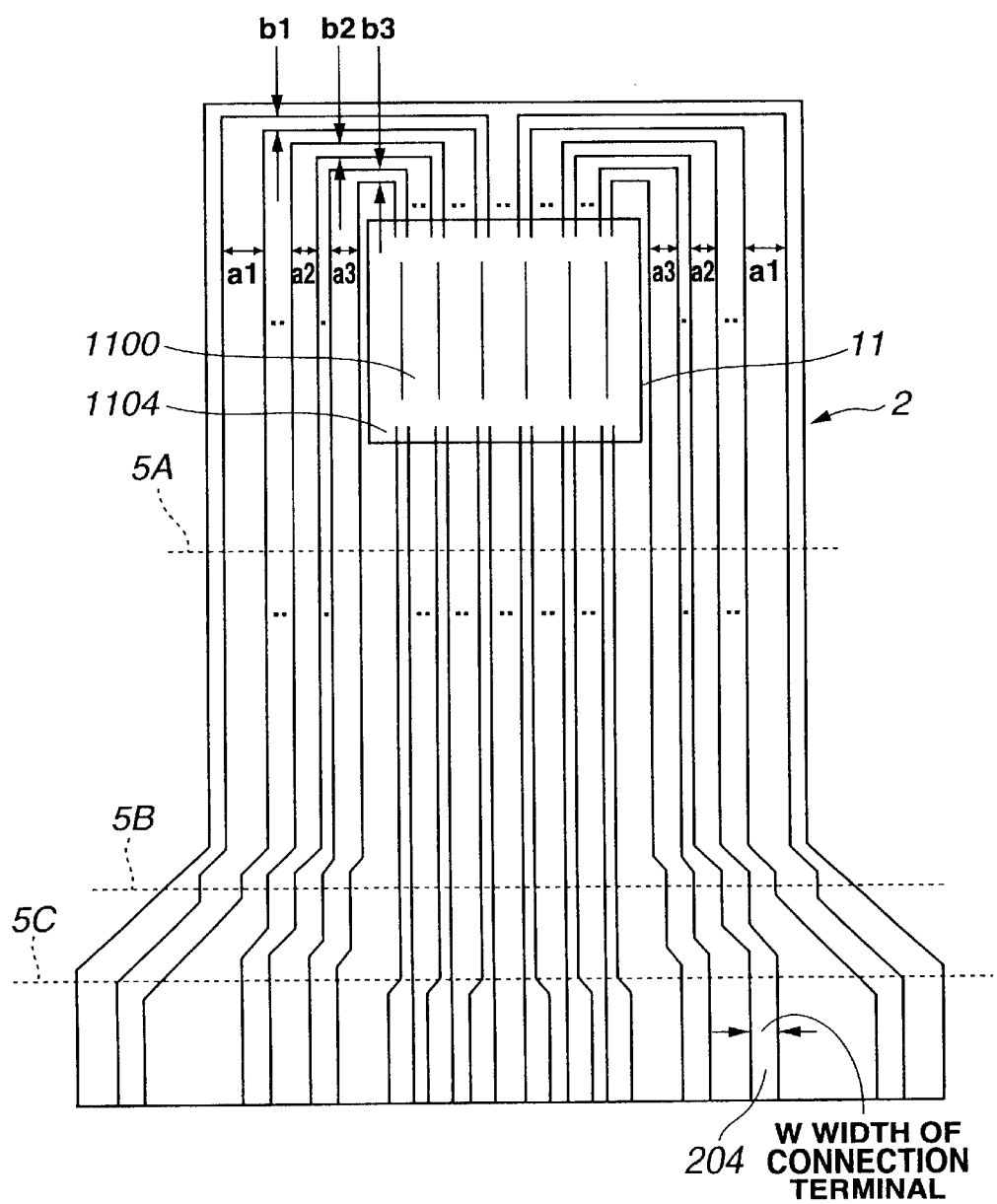
FIGS. 5 and 6 are diagrams, each illustrating a flexible wire pattern on a flexible-film wire substrate of the ink-jet recording head of the first embodiment.
Figure 6:
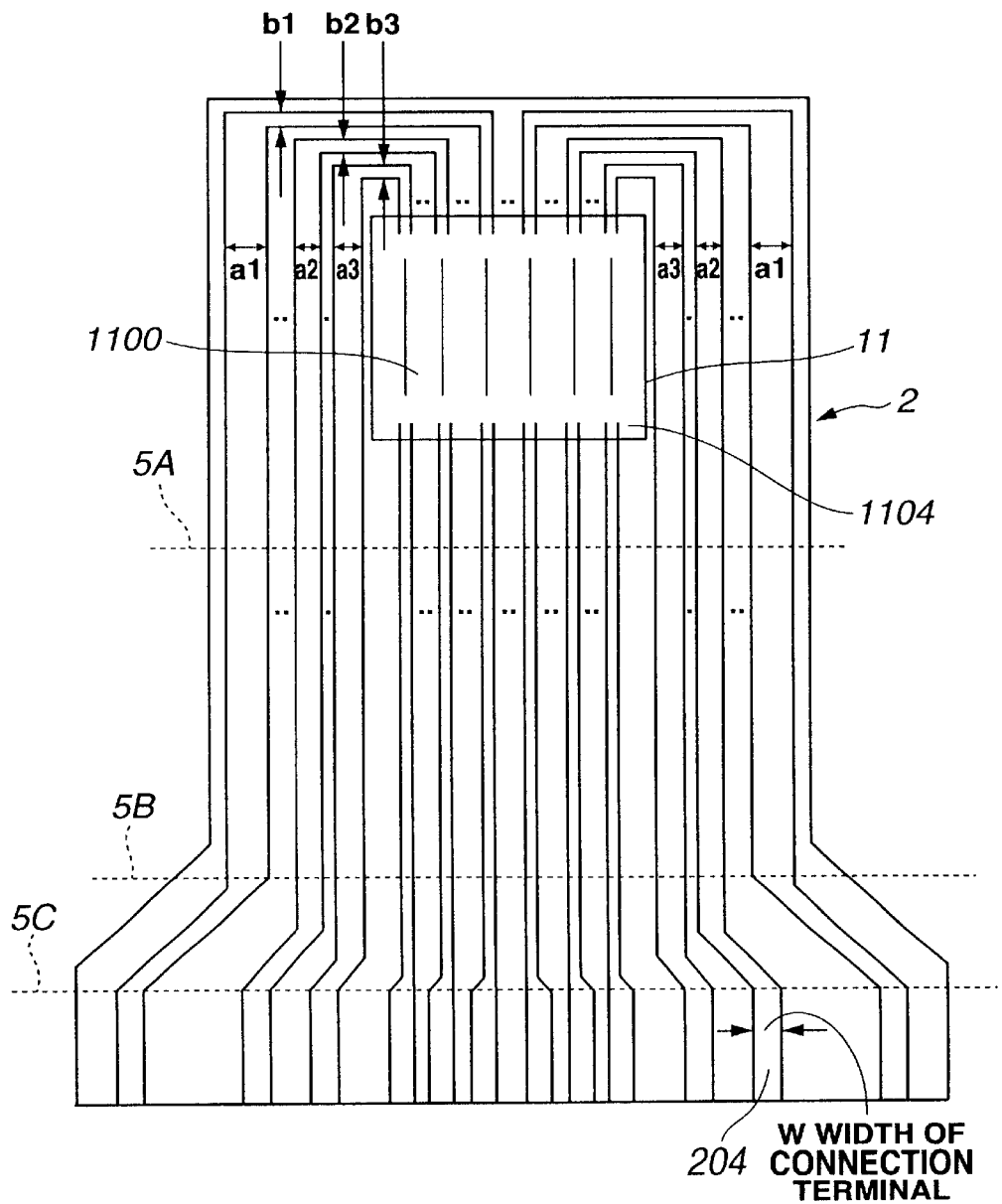

FIGS. 5 and 6 are diagrams, each illustrating a flexible wire pattern of the flexible-film wire substrate 2 of the first embodiment. Although the actual wire pattern is much finer (about 0.035–0.5 mm) than that shown in FIGS. 5 and 6, the wire pattern is illustrated by being magnified for the convenience of explanation.

The electrode portions of the recording-element substrate 1100 are disposed near facing edges of a rectangular device hole 11 of the flexible-film wire substrate 2, and are electrically connected to the flexible wire pattern on the flexible-film wire substrate 2. A terminal connection portion (connection portions of a plurality of input terminals 204) of the flexible-film wire substrate 2 includes signal-line input terminals where relatively small currents flow, and power-supply-line input terminals to be connected to a power supply for supplying a recording liquid with thermal energy, ground and the like. A terminal connection portion (connection portions of a plurality of output terminals) of the wire substrate 5 includes signal-line output terminals and power-supply-line output terminals corresponding to the above-described respective signal-line input terminals and power-supply-line input terminals. The input terminals 204 of the flexible-film wire substrate 2 and output terminals of the wire substrate 5, whose number is several tens to several hundreds, are electrically connected at a pitch of 100–500 μm.

As shown in FIGS. 5 and 6, in the flexible wire pattern from the electrode portions 1104 of the recording-element substrate 1100, the distance between an electrode portion 1104 and the corresponding input terminal 204 is longer as the input terminal 204 is closer to an external circumference of the flexible-film wire substrate 2. The widths of wires of the flexible wire pattern have a relationship of a1>a2>a3, such that the width of the wire closer to an external circumference is larger. The resistance of each wire from an electrode portion 1104 to the corresponding input terminal 204 is designed to be substantially equal by adjusting the widths a1, a2 and a3.

Since the flexible-film wire substrate 2 is designed to have a larger width at a terminal connection portion to the wire substrate 5 so as to have a large width of each wire terminal with a large pitch between wire terminals, there is provided a portion where the width of the substrate gradually increases such that each external circumferential portion is obliquely widened. As shown in FIGS. 5 and 6, the flexible wire pattern has obliquely deflected portions at the portion where the width of the substrate gradually increases. That is, the flexible wire pattern is obliquely deflected at least between a bent portion 5B and a bent portion 5C of the flexible-film wire substrate 2 so as to increase the pitch from the bent portion 5B to the bent portion 5C. Furthermore, wires of the flexible wire pattern near the center of the bent portion 5B are obliquely deflected toward external circumferential portions at positions near the wire substrate 5 compared with wires near end portions of the bent portion 5B.

In the first embodiment, the flexible-film wire substrate 2 is bent at the bent portions 5A, 5B and 5C shown in FIGS. 5 and 6, as shown in FIG. 3. The bent portion 5A near the recording-element substrate 1100 is bent so as to provide a first crest, the bent portion 5C near the wire substrate 5 for inputting an control signal from an external apparatus to the input terminals 204 is bent so as to provide a second crest, and the bent portion 5B between the bent portions 5A and 5B is bent so as to provide a valley. As for the wire pattern shown in FIG. 5, respective wires at both end portions are bent twice around the bent portion 5B so that wires are perpendicular to the bending line of the bent portion 5B near the bent portion 5B. Although the wires are bent twice in the first embodiment, the number of bends is not limited to a specific number. The wire pattern shown in FIG. 6 is bent between the bent portion 5B and the bent portion 5C. In the flexible wire pattern shown in FIGS. 5 and 6, wires are substantially orthogonal to bending lines of the bent portions 5A, 5B and 5C which are substantially linear over the entire region. As a result, it is possible to excellently bend the flexible-film wire substrate 2 as shown in FIG. 3, without breaking wires and sagging the flexible-film wire substrate 2.

Since the width of the flexible-film wire substrate 2 is large only at and near the terminal end portion (connection portions of output terminals) of the flexible-film wire substrate 2 to the wire substrate 5, the flexible-film wire substrate 2 is held on different surfaces (the lower surface and the rear surface in the case of FIG. 3) of the ink supply/holding member 4 by bending the flexible-film wire substrate 2 at the bent portion 5A. As a result, it is possible to reduce the size of the recording head unit.

(Second Embodiment)

Figure 7:
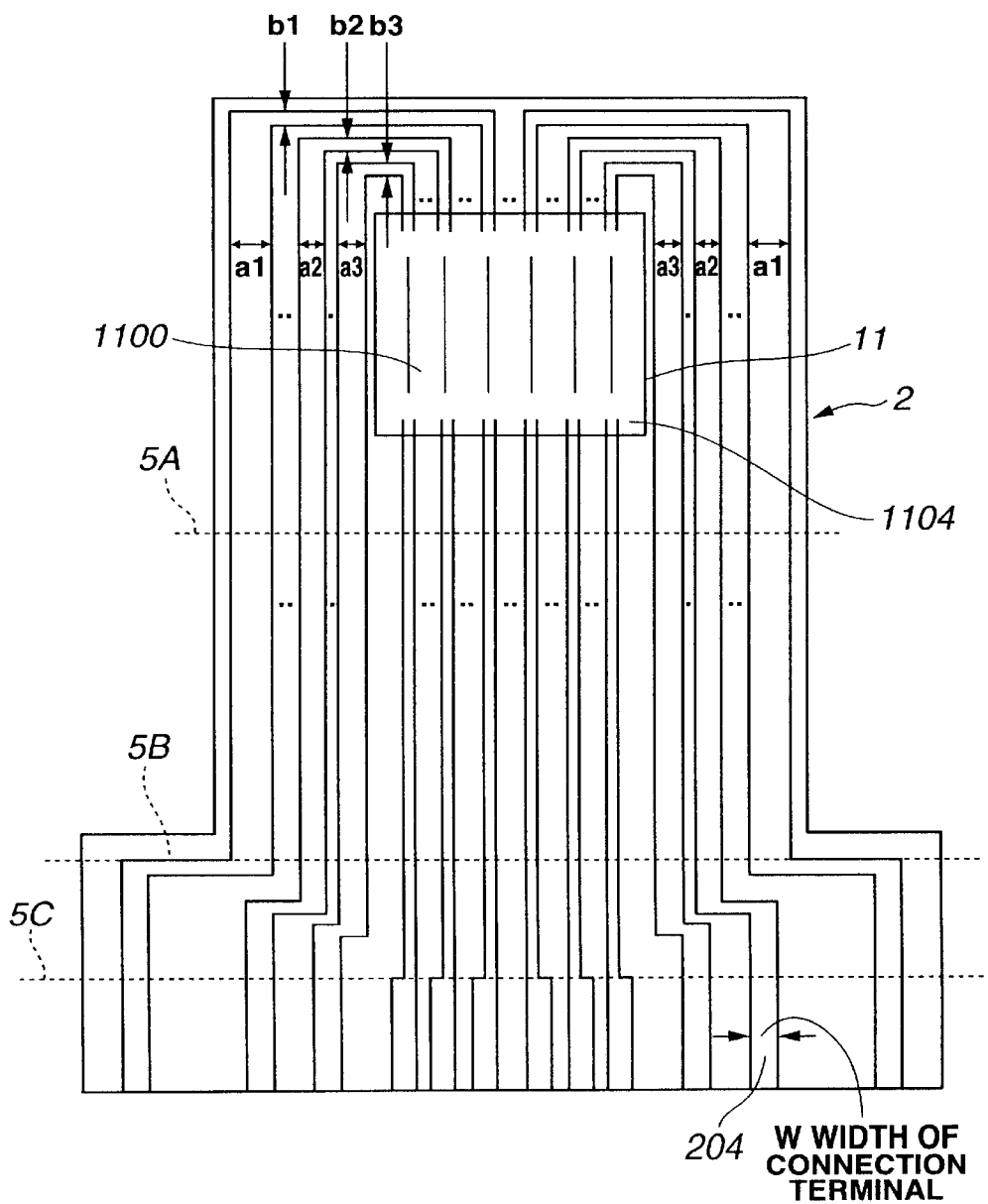
FIG. 7 is a diagram illustrating a flexible wire pattern on a flexible-film wire substrate of an ink-jet recording head according to a second embodiment of the present invention.

FIG. 7 illustrates a flexible wire pattern of a flexible-film wire substrate of an ink-jet recording head according to a second embodiment of the present invention. In the second embodiment, description for the same components as those in the first embodiment will be omitted, and only a configuration different from the configuration in the first embodiment will be described.

A flexible-film wire substrate 2 according to the second embodiment has a portion where the width is increased so as to provide larger widths of terminals and larger pitches between adjacent terminals at a terminal connection portion to the wire substrate 5. As shown in FIG. 7, wires of the flexible wire pattern are orthogonally deflected at portions where the width of the substrate 2 increases.

In the second embodiment, the flexible-film wire substrate 2 is also bent at bent portions 5A, 5B and 5C, as shown in FIG. 3. The bending lines at the bent portions 5A, 5B and 5C of the flexible-film wire substrate 2 are perpendicular to the flexible wire pattern, and the bent portions 5A, 5B and 5C are substantially linear over the entire region. Accordingly, as in the first embodiment, it is possible to excellently bend the flexible-film wire substrate 2.

(Third Embodiment)

Figure 8:
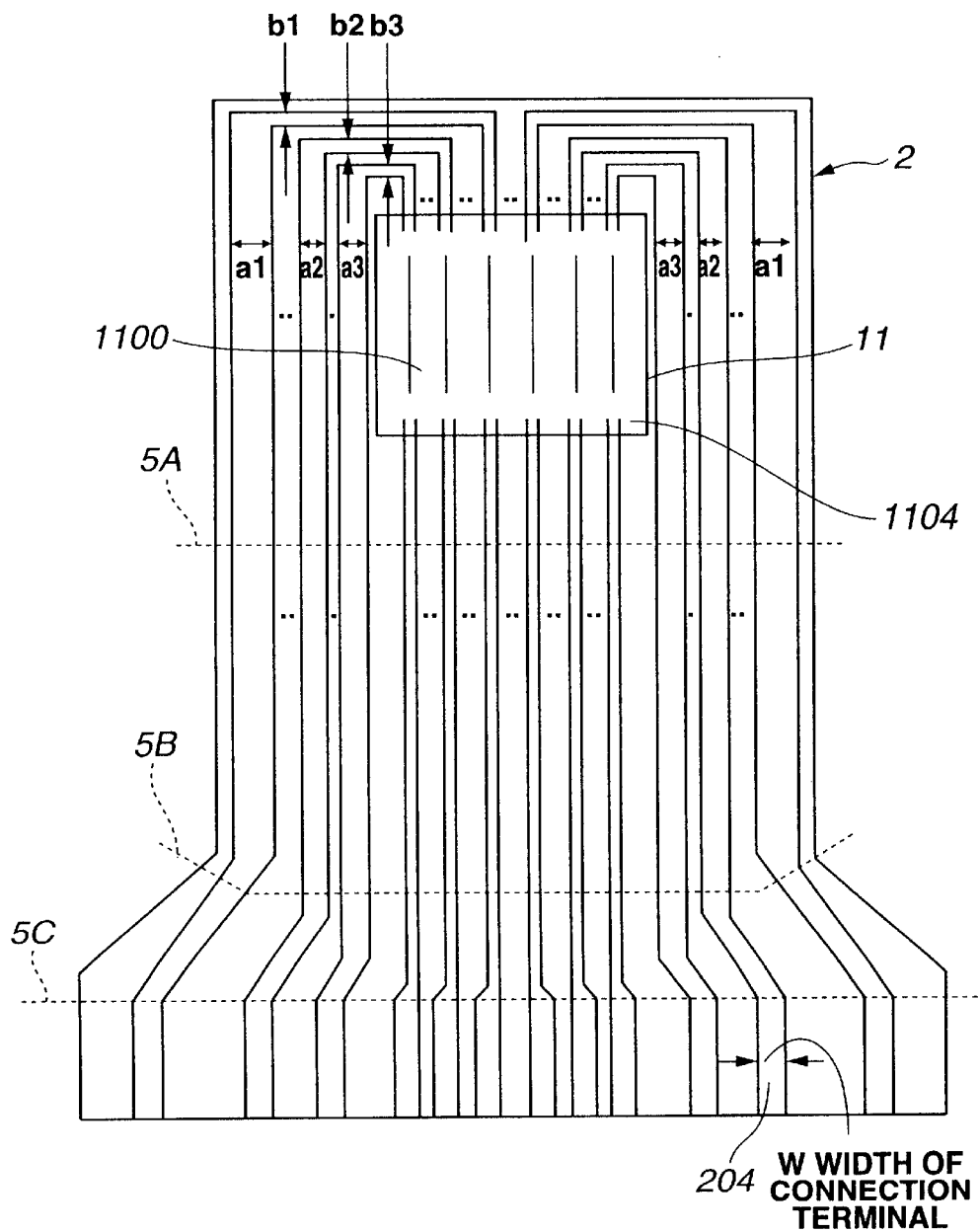
FIG. 8 is a diagram illustrating a flexible wire pattern on a flexible-film wire substrate of an ink-jet recording head according to a third embodiment of the present invention.

FIG. 8 illustrates a flexible wire pattern of a flexible-film wire substrate of an ink-jet recording head according to a third embodiment of the present invention. In the third embodiment, description for the same components as those in the first embodiment will be omitted, and only a configuration different from the configuration in the first embodiment will be described.

In FIG. 8, since a flexible-film wire substrate 2 has a portion where the width is increased so as to provide larger widths of wire terminals and larger pitches between adjacent wire terminals at a terminal connection portion to the wire substrate 5, there is a portion where the width of the substrate gradually increases. In this portion, external circumferential portions are obliquely widened toward the outside. As shown in FIG. 8, obliquely deflected portions are provided at the portion where the width of the substrate gradually increases. Particularly, wires near side ends of the flexible-film wire substrate 2 are more obliquely deflected compared with wires at a central portion.

In the third embodiment, when bending the flexible-film wire substrate 2 at three portions as shown in FIG. 3, the flexible-film wire substrate 2 is bent substantially perpendicularly to the flexible wire pattern as at bent portions 5A, 5B and 5C shown in FIG. 8. In the third embodiment, the bent portion 5B is substantially linear at least near a central portion thereof, and bent positions at end portions of the bent portion 5B are closer to the bend portion 5A than the bent position of a central portion of the bent portion 5B.

In the third embodiment, since wires at a central portion of the flexible-film wire substrate 2 where the number of wires is larger than at end portions of the flexible-film wire substrate 2 cross substantially linear bent portions, projections and recesses in the flexible-film wire substrate 2 are reduced. Accordingly, it is possible to excellently bend the flexible-film wire substrate 2, as shown in FIG. 3.

(Comparative Example)

Figure 9:
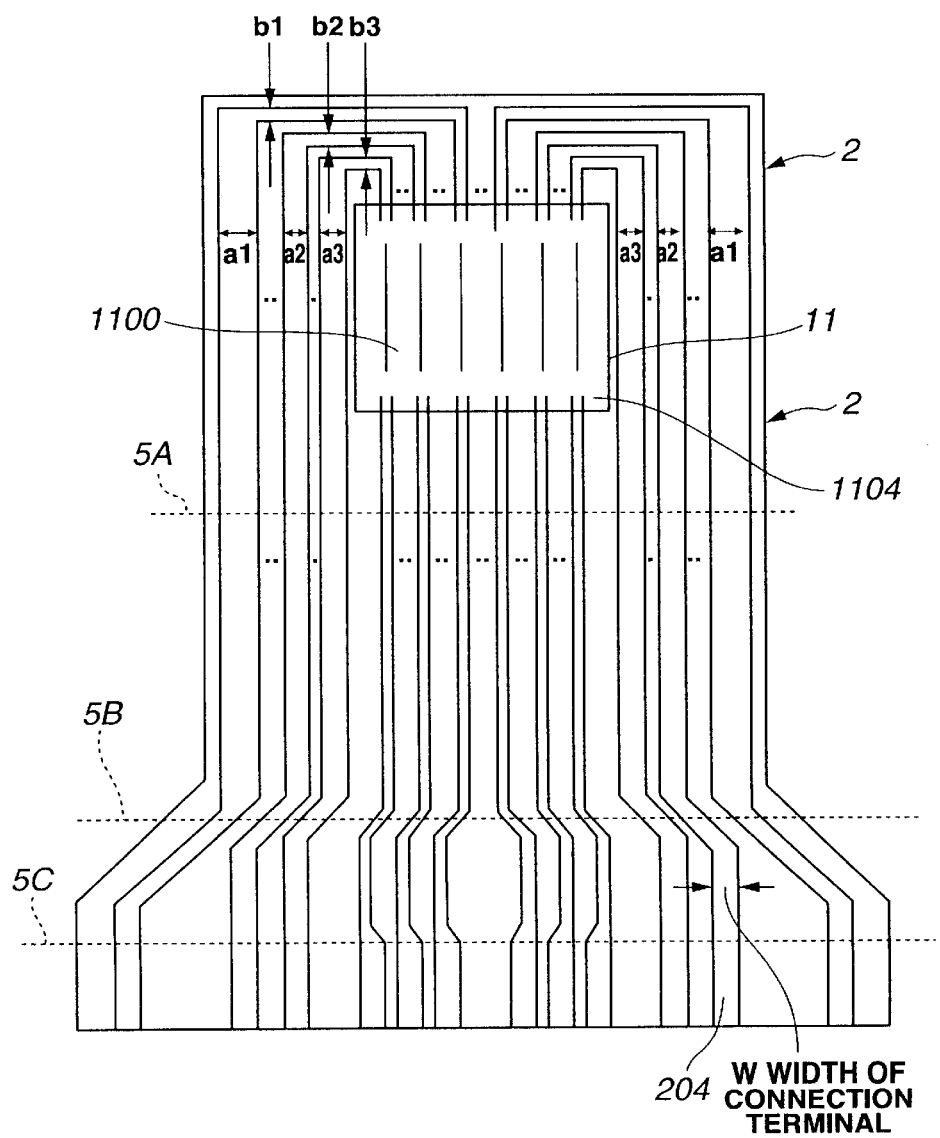
FIG. 9 is a diagram illustrating a flexible wire pattern of a comparative example with respect to the present invention.

FIG. 9 illustrates a flexible wire pattern of a comparative example with respect to the present invention, in which wires at a bent portion 5B are provided obliquely with respect to a bending line toward external circumferential sides of a flexible-film wire substrate. As shown in FIG. 9, in the flexible wire pattern from electrode portions 1104 of a recording-element substrate 1100, the distance between an electrode portion 1104 and the corresponding input terminal 204 is longer as the input terminal 204 is closer to an external circumference of the flexible-film wire substrate 2. The widths of wires of the flexible wire pattern have a relationship of a1>a2>a3, such that the width of the wire closer to an external circumference is larger. The resistance of each wire from the electrode portion 1104 to the input terminal 204 is designed to be substantially equal by adjusting the widths of a1, a2 and a3.

In this comparative example, intensive studies by the inventor of the present invention to try to bend the flexible-film wire substrate 2 at bent portions 5A, 5B and 5C shown in FIG. 9 have cleared the following problems.

That is, in this comparative example, since the wire pattern of the flexible-film wire substrate 2 is perpendicular to bending lines at the bent portions 5A and 5C, it is possible to bend the flexible-film wire substrate 2 as shown in FIG. 3. However, as shown in FIG. 9, at the bent portion 5B, wires provided symmetrically with respect to the center of the substrate are formed obliquely, i.e., not perpendicularly, with respect to the bending line. Hence, a stress tending to bend the flexible-film wire substrate 2 in a direction perpendicular to the bending line. As a result, problems arise such that, for example, the flexible-film wire substrate 2 has projections and recesses in a sagged state, and a wire is broken.

An ink-jet recording head in which the flexible wire pattern of the comparative example has projections and recesses has the problem that, when mounting the recording head in the main body of a printer, projections on the flexible-film wire substrate interfere with a sheet pressing roller.

(Another Embodiment)

Figure 10:
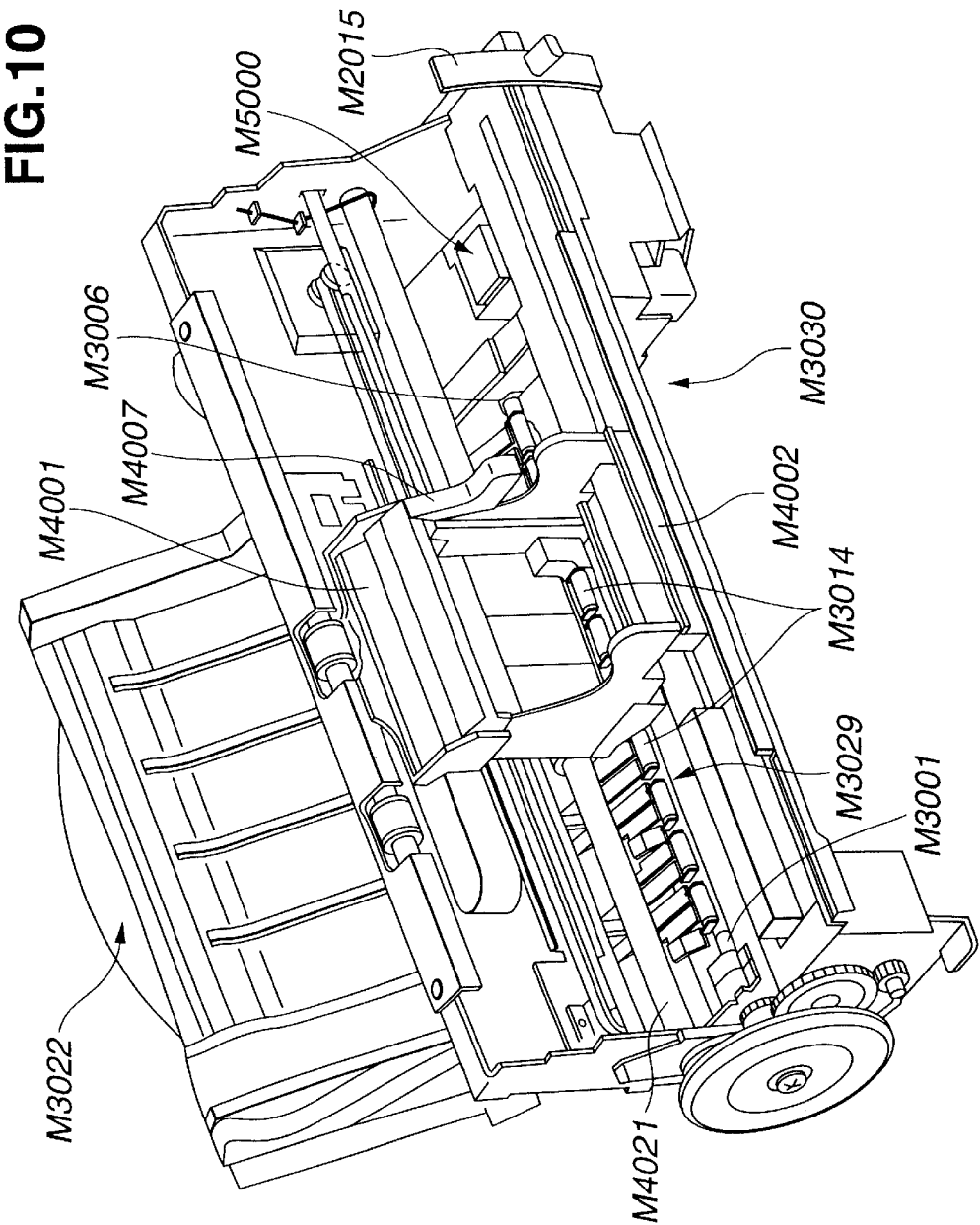
FIG. 10 is a perspective view illustrating an ink-jet recording apparatus which mounts the ink-jet recording head according to the present invention.
Figure 11:
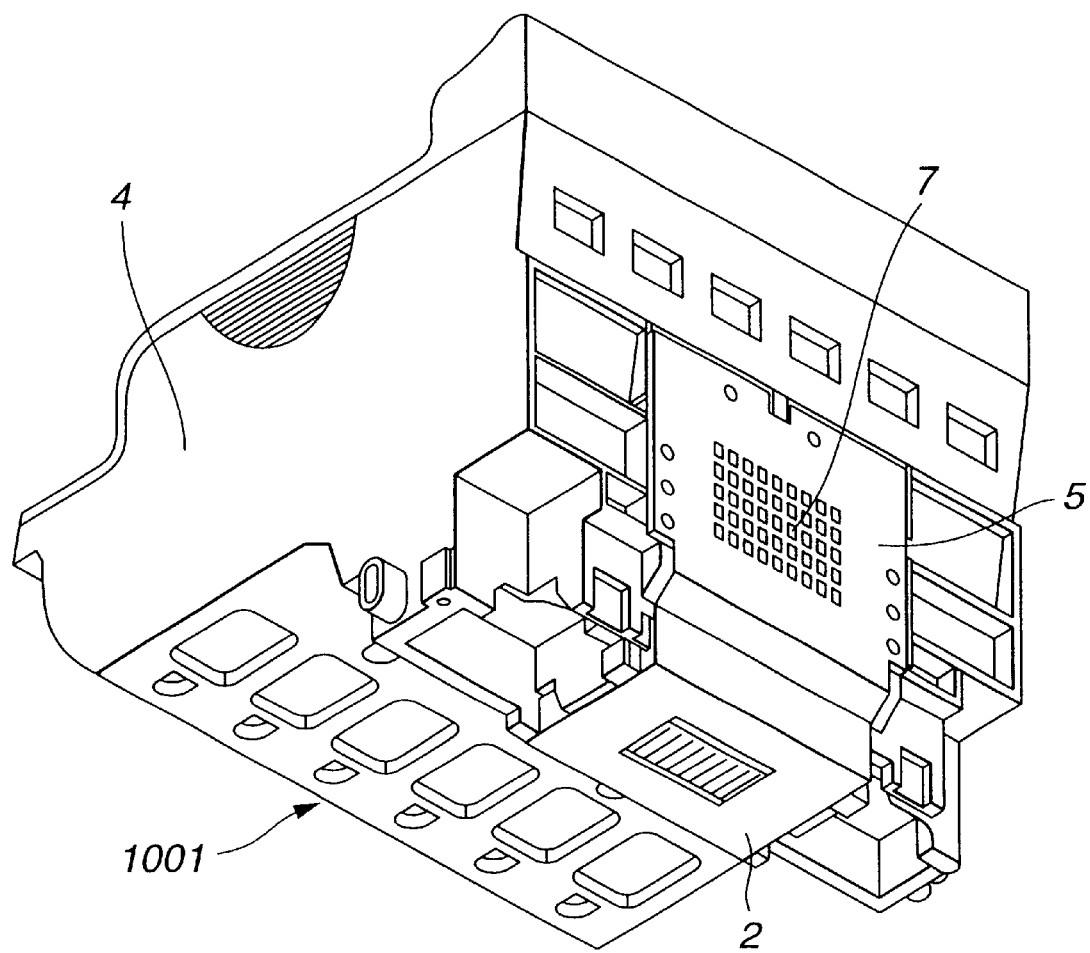
FIG. 11 is a perspective view illustrating the configuration of a conventional ink-jet recording head unit, as seen from a rear back side.
Figure 12:
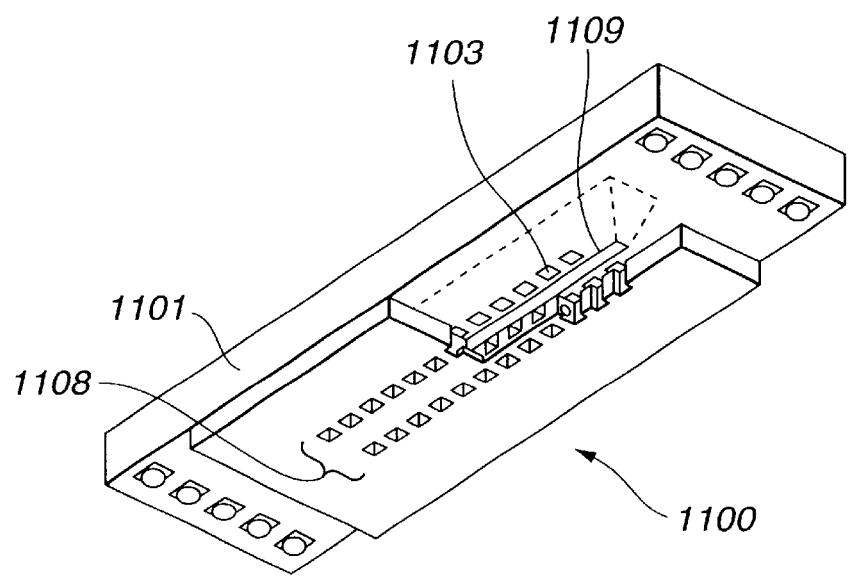
FIG. 12 is a diagram illustrating the details of a recording-element substrate shown in FIG. 11.

FIG. 10 illustrates an ink-jet recording apparatus in which the ink-jet recording head of one of the above-described embodiments is mounted. In FIG. 10, in order to explain the features of the ink-jet recording apparatus of the invention, the ink-jet recording head is removed.

As shown in FIG. 10, a carriage M4001 includes a carriage cover M4002, engaged with the carriage M4001, for guiding the recording head (1001 shown in FIG. 2) to a mounting position of the carriage M4001, and a head setting lever M4007, engaged with a tank holder (4 shown in FIG. 2) of the recording head, for pressing the recording head so as to be set at a predetermined mounting position. The head setting lever M4007 is provided at an upper portion of the carriage M4001 so as to be rotatable around the shaft of the head setting lever M4007. A head setting plate (not shown) is provided at an engaged portion with respect to the recording head via a spring. The recording head is mounted in the carriage M4001 while pressing the recording head by the spring force of the spring.

A pinch roller (sheet pressing roller) M3014, serving as a conveyance member for conveying a recording material (such as paper, an OHP (overhead projector) sheet or the like), onto which ink discharged from the ink-jet recording head is caused to adhere, is provided near the recording head. As described above, by disposing the pinch roller M3014 near the valley portion of the flexible-film wire substrate 2, the pinch roller M3014 and the flexible-film wire substrate 2 do not interfere, resulting in reduction of the size of the apparatus. By disposing the pinch roller M3014 in the above-described manner, a portion of the recording material near the recording head 1001 is pressed by the pinch roller M3014. As a result, it is possible to assuredly convey the recording material while suppressing fluctuation of the recording material. Accordingly, disposition of the pinch roller M3014 near the valley portion of the flexible-film wire substrate 2 greatly contribute to an optimum recording operation and improvement in the quality of the recorded image.

The individual components shown in outline in the drawings are all well known in the ink-jet recording head and ink-jet recording apparatus arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An ink-jet recording head comprising:
    a flexible-film wire substrate;
    a recording-element substrate comprising energy generation elements for generating energy for discharging a recording liquid, said recording-element substrate being electrically connected to said flexible-film wire substrate; and
    a wire substrate where a signal for controlling generation of the energy on said recording-element substrate is input from an external apparatus, said wire substrate being electrically connected to said recording-element substrate via a plurality of wires formed on said flexible-film wire substrate,
    wherein said flexible-film wire substrate is bent so as to provide a first crest portion near said recording-element substrate, a second crest portion near said wire substrate, and a valley portion positioned between the first crest portion and the second crest portion,
    wherein a bent portion of each of the first crest portion and the second crest portion is substantially linear over the entire region,
    wherein the plurality of wires are deflected so that a pitch increases from the valley portion to the second crest portion on said flexible-film wire substrate at least between the valley portion and the second crest portion, and
    wherein the plurality of wires are substantially orthogonal to respective bent portions of the first crest portion, the second crest portion and the valley portion.

2. An ink-jet recording head according to claim 1, wherein a width of said flexible-film wire substrate at the second crest portion is larger than a width at the first crest portion.

3. An ink-jet recording head according to claim 1, wherein the bent portion of the valley portion is substantially linear at least near a central portion of the valley portion.

4. An ink-jet recoding head according to claim 3, wherein the bent portion of the valley portion is substantially linear over the entire region.

5. An ink-jet recording head according to claim 1, wherein the plurality of wires are deflected a plurality of times in front of and behind the valley portion.

6. An ink-jet recording head according to claim 1, wherein bent positions at end portions of the valley portion are closer to the first crest portion than a bent position of a central portion of the valley portion.

7. An ink-jet recording apparatus according to claim 1, wherein, from among the plurality of wires, wires near a central portion of the valley portion are deflected at a portion closer to said wire substrate than wires near end portions of the valley portion.

8. An ink-jet recording apparatus according to claim 1, wherein a plurality of recording-element substrates are mounted on said flexible-film wire substrate.

9. An ink-jet recording head according to claim 1, wherein a wire resistance of each of the wires is substantially equal.

10. An ink-jet recording head according to claim 1, wherein each of the energy generation elements comprises an electrothermal transducer for generating thermal energy.

11. An ink-jet recording head according to claim 1, wherein said flexible-film wire substrate comprises a film whose base material is flexible polyimide.

12. An ink-jet recording apparatus comprising:
    an ink-jet recording head according to claim 1;
    a carriage for mounting said ink-jet recording head; and
    conveyance means for conveying a recording medium, said ink-jet recording apparatus performing recording by causing the recording liquid discharged from said ink-jet recording head to adhere onto the recording medium,
    wherein said conveyance means is positioned near the valley portion of said ink-jet recording head.

* * * * *